United States Patent [19]
Schaefer et al.

[11] Patent Number: 5,809,049
[45] Date of Patent: Sep. 15, 1998

[54] METHOD AND APPARATUS FOR MONITORING THE RF DRIVE CIRCUIT OF A LINEAR LASER TRANSMITTER

[75] Inventors: Mark Steven Schaefer, Salem, N.H.; David B. Winick, Bedford, Mass.

[73] Assignee: Lucent Technologies Inc., Murray Hill, N.J.

[21] Appl. No.: 770,100

[22] Filed: Dec. 19, 1996

[51] Int. Cl.[6] .................................................. H01S 3/00
[52] U.S. Cl. ............................................................ 372/38
[58] Field of Search ........................................ 372/26, 38

[56] References Cited

U.S. PATENT DOCUMENTS 5,394,416  2/1995  Ries ............................................ 372/38
5,408,485  4/1995  Ries ............................................ 372/38
5,450,198  9/1995  Killpatrick et al. ........................ 372/94

*Primary Examiner*—Rodney B. Bovernick
*Assistant Examiner*—Robert E. Wise

[57] ABSTRACT

The present invention monitors the RF drive circuitry of a linear laser transmitter. In one preferred embodiment of the present invention, a filtered RF signal from the monitor diode is amplified and then input to a peak detector. The output of the peak detector is then fed to the input of a threshold detector, wherein the threshold detector determines whether the output of the peak detector is above a predetermined threshold. If the output of the peak detector falls below the predetermined threshold an alarm is generated at the status monitoring ports of the laser transmitter.

18 Claims, 4 Drawing Sheets

METHOD AND APPARATUS FOR MONITORING THE RF DRIVE CIRCUIT OF A LINEAR LASER TRANSMITTER

FIELD OF THE INVENTION

The present invention relates to optical transmitters used to generate signals through fiber-optic cables, and more particularly to a method and apparatus for monitoring the RF drive circuit of a linear laser transmitter.

BACKGROUND OF THE INVENTION

Optical transmitters which convert an RF signal to an intensity-modulated signal suitable for propagation through fiber optic cables typically employ semiconductor lasers. Since the intention is to maintain a linear transfer characteristic during the conversion process from an RF signal to the intensity-modulated signal, the semiconductor laser must remain biased at a setting significantly above the stimulated emission threshold, wherein this setting is referred to as the quiescent DC laser forward bias current ($I_F$) Corresponding to this forward bias current setting $I_F$, a specific optical power is emitted from the laser device. Additionally, when an AC-coupled RF signal is impressed upon $I_F$, fluctuations of optical power intensity from the quiescent DC bias point result.

Typically, a closed-loop control circuit incorporating negative optical feedback is used to maintain a constant quiescent optical output power in the semiconductor laser. The optical feedback can be carried out using a photodetector to either sense the variation in optical power emitted from the rear facet of the laser or tap off and monitor a small portion of the fiber-coupled power emitted from the front facet. The photodetector represents a current source proportional in magnitude to the laser optical power output. In typical applications, this signal is then conditioned via a transimpedance gain stage, developing a voltage proportional in magnitude to the laser optical power output. A slow-response control system compares the transimpedance voltage with a reference level and adjusts the laser $I_F$ automatically to maintain a constant quiescent optical power output. Silicon PIN diodes generally exhibit a stable long-term responsively suitable to monitor the laser output and adjust the laser bias level.

Monitoring the RF drive circuits of the laser transmitter, however, presents a somewhat more complicated situation. A method used in the prior art to monitor the RF drive circuitry is to tap into the actual output signal using a low loss tap. This method has disadvantages, however, in that circuitry other than that already found in the transmitter is required. Additionally, losses or other degradation are experienced in the output signal. Accordingly, there is a need for a more efficient manner in which to monitor the RF drive circuit of a linear laser transmitter.

SUMMARY OF THE INVENTION

The present invention discloses an apparatus and method to monitor the RF drive circuitry of a linear laser transmitter. In one preferred embodiment of the present invention, a filtered response signal from the monitor diode is amplified and then input to a peak detector. The output of the peak detector is then fed to the input of a threshold detector, wherein the threshold detector determines whether the output from the peak detector is above a predetermined threshold. If the output of the peak detector falls below the predetermined threshold an alarm is generated at status monitoring ports of the laser transmitter.

In an alternate embodiment of the present invention, the output of the peak detector is coupled to a voltage controlled attenuator (VCA) having an adjustable output level. An RF input signal is fed into the VCA and the output thereof is input to the laser transmitter. The signal from the monitor diode is utilized as an automatic gain controller to compensate for the drifting of the drive circuitry, or to compensate for changes in quantum efficiency of the laser device in the transmitter.

In another alternate embodiment of the present invention the peak detector is coupled to the input of a voltage controlled equalizer (VC Eq) instead of a VCA. This embodiment may be utilized as part of an end-to-end monitoring scheme which monitors the pilot tones at the optical receiver, coaxial amplifier and beyond. In addition, the instant embodiment may be utilized as part of an automatic tilt control circuit. This type of circuit compensates for changes in the RF transfer characteristics of the drive circuitry.

BRIEF DESCRIPTION OF THE FIGURES

For a better understanding of the present invention, reference may be had to the following description of exemplary embodiments thereof, considered in conjunction with the accompanying drawings, in which.

DETAILED DESCRIPTION

Figure 1:
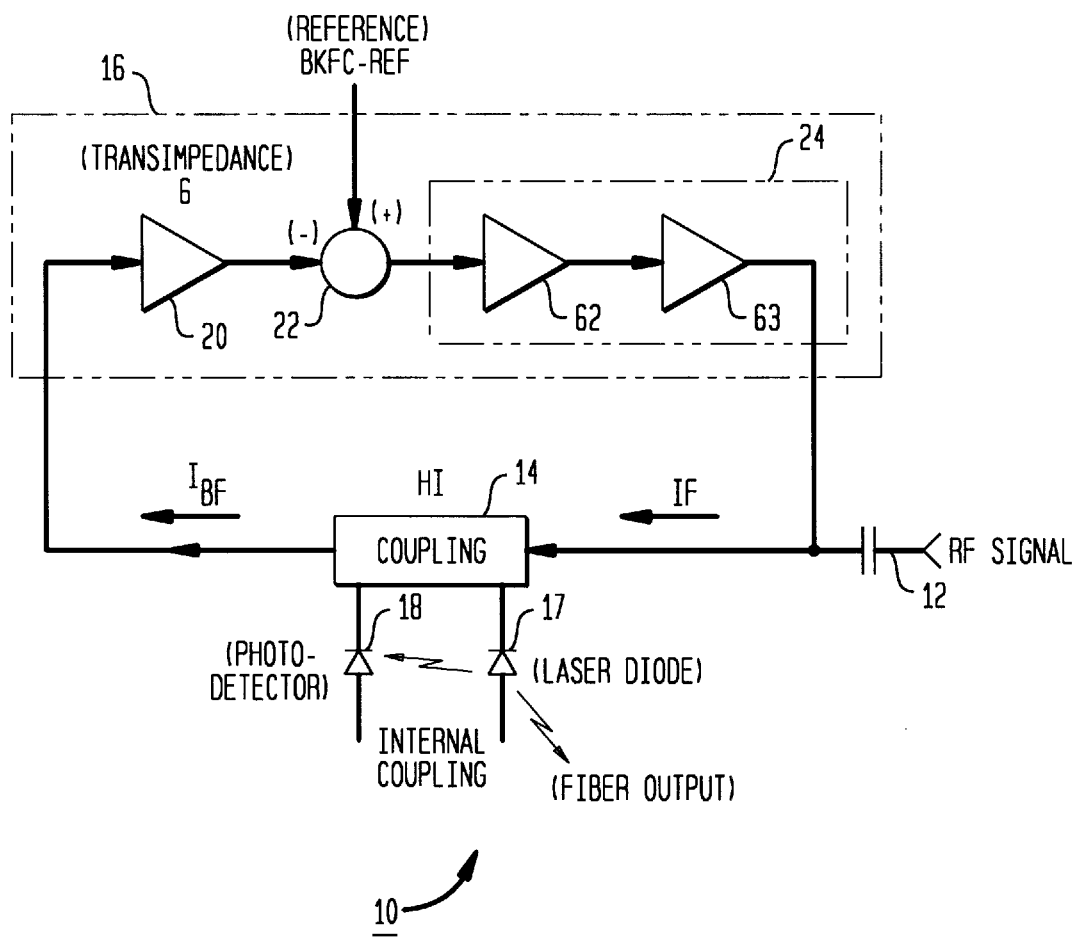
FIG. 1 shows a circuit diagram of a power control circuit for a laser transmitter used in conjunction with the present invention monitoring scheme.

The present invention discloses a novel method and apparatus for monitoring the RF drive circuitry of a linear laser transmitter. Referring to FIG. 1, there is shown an exemplary embodiment of an automatic power control circuit 10 for a semiconductor laser. In the shown embodiment, a closed-loop control circuit incorporating negative optical feedback is used to maintain a constant quiescent optical output power in the semiconductor laser. As shown an RF input signal, for example, an AC-coupled RF signal enters the power control circuit at input port 12. Here, the RF signal is joined or coupled with laser forward bias current, $I_F$, which is generated from the feedback loop. The combined current passes through a coupling circuit 14 having a laser diode 17 and a monitor diode, for example, or photodetector 18 connected thereto, wherein the laser diode is biased according to the laser forward bias current $I_F$. As would be understood by a person skilled in the art, the coupling circuit is also representative of the internal coupling which is present between the laser diode 17 and the photodetector 18. The photodetector 18 represents a current source proportional in magnitude to the laser optical power output. Accordingly, an AC-coupled RF signal which is impressed upon the DC laser forward bias current, $I_F$, results in fluctuations of optical power intensity from the quiescent DC bias point and a corresponding fluctuation in the current produced by the photodetector 18.

The signal which emanates from the coupling circuit 14 as a result of the connection to the photodetector 18 is appropriately termed the back facet monitor current $I_{BF}$. This signal, $I_{BF}$, is then conditioned within the closed loop power control circuit 10 by means of a bias control circuit 16 which automatically adjust the laser forward bias $I_F$ in order to maintain a constant quiescent optical power output. The bias control circuit includes a transimpedance gain stage 20, which conditions the input current $I_{BF}$, developing a voltage proportional in magnitude to the laser optical power output. A slow-response control system 22 compares the transimpedance voltage with a reference level and adjusts the voltage according to this reference level, if necessary. As would be understood, this voltage is then amplified and converted to a corresponding current by means of amplifier combination 24 which includes amplifiers G2 and G3. Thus, the bias control circuit adjusts the laser $I_F$ automatically to maintain a constant quiescent optical power output for the laser transmitter.

Figure 2:
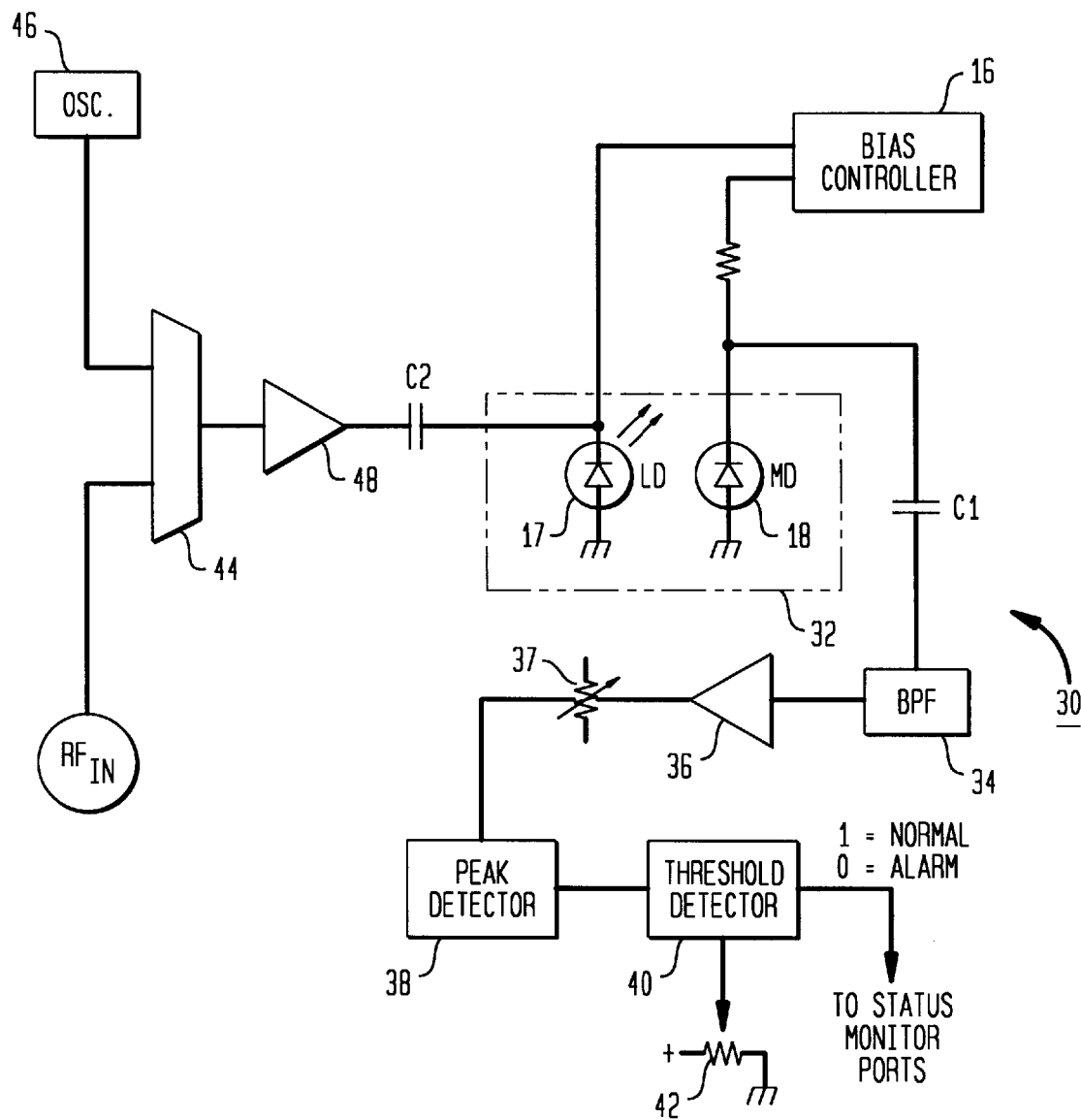
FIG. 2 shows a block diagram of one exemplary embodiment of a circuit for monitoring the drive circuitry of a laser transmitter in accordance with the present invention.

Referring to FIG. 2, there is shown one preferred embodiment of a monitor circuit 30 in accordance with the present invention, wherein like components from illustrated embodiments are labeled with like reference numbers. As shown, a laser transmitter assembly 32 includes a laser diode 17 and a monitor photodiode 18 coupled to a bias controller 16 in a similar manner to that shown with respect to FIG. 1. The cathode of the monitor diode 18 is coupled to the input of a bandpass filter 34 through capacitor C1. In the preferred embodiment the monitor diode 18 is a wideband PIN diode as opposed to a narrowband diode typically utilized for monitoring purposes. The wideband PIN diode has the advantage of detecting a wider range of frequencies within the drive circuitry.

The bandpass filter 34 is coupled to an amplifier 36 which is in turn coupled to a variable attenuator 37. The attenuator 37 is coupled to a peak detector 38 which is then coupled to the input of a threshold detector 40. The output of the threshold detector 40 is applied, for example, to monitor ports (not shown) for monitoring the status of the RF drive circuitry of the laser transmitter. In addition, the level of the threshold detector 40 is adjustable, for example, by means of a potentiometer-type device 42. As would be understood, one or more of the above-described monitor circuits may be coupled at the photodiode in order to monitor various frequency ranges present within the laser transmitter.

In the shown embodiment, an AC-coupled RF input signal is input to a directional coupler 44 along with the input of an oscillator 46 to provide out-of-band pilot tones. The combined signal is then input to an amplifier 48, for example an RF broadband laser driver amplifier, which signal is then input to the laser driver assembly through capacitor C2.

In describing the operation of the monitor circuit 30, the signal present at the monitor diode is input to the bandpass filter 34. Capacitor C1 filters out any dc component so that a modulated signal proportional to that of the RF signal input to the transmitter is present at the bandpass filter 34. As would be understood, the bandpass filter limits the modulated signal to a predetermined passband of frequencies, wherein only the signal components or frequencies falling within the passband are output to the amplifier. The signal output from the bandpass filter 34 is amplified by means of amplifier 36 and then transmitted to the peak detector 38.

In the preferred embodiment of the invention, the output of the amplifier enters a variable attenuation device 37 where the signal level is adjusted prior to entering the peak detector 38. The peak detector, as is well known in the art, provides an output voltage which is the true peak value of the applied signal. The output from the peak detector 38 is then input to the threshold detector 40 which is adjusted to sense a predetermined threshold voltage. As long as the output from the peak detector 38 remains above the threshold level, a first signal value, for example, a logic "1" will be output from the threshold detector 40. If the output of the peak detector falls below the predetermined threshold then a second signal value, for example, logic "0" will be present at the output of the threshold detector. As will be understood, as long as the peak detector 38 receives a modulated signal generated from the monitor diode 18 in response to the AC coupled RF input signal, the peak value output from the peak detector will be maintained. If, however, the modulated signal ceases to exist at the peak detector, the output from the peak detector will fall below the threshold level indicating a failure in the RF drive circuitry. Accordingly the signal from the monitor diode can be used to efficiently detect hard failures in the drive circuits of a laser transmitter.

Figure 3:
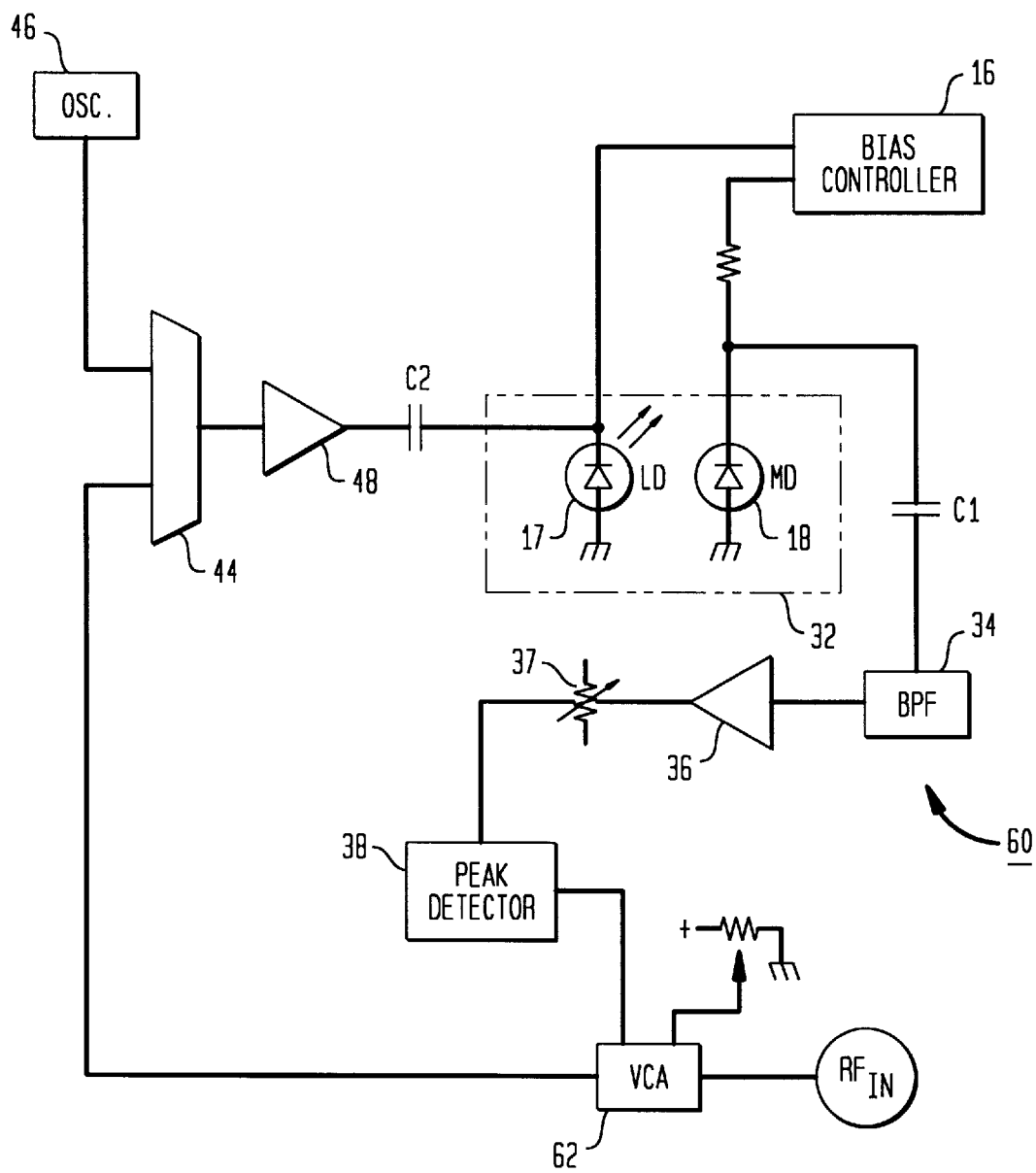
FIG. 3 shows a block diagram of a second exemplary monitoring circuit in accordance with the present invention.

Referring to FIG. 3, there is shown an alternate embodiment of the present invention monitoring circuitry 60 wherein like components from the previous embodiment are assigned like numbers. In a similar fashion to the embodiment shown in FIG. 2, a signal from the monitor diode 18 is input to a bandpass filter 34 through capacitor C1. The output of the bandpass filter is then input to an amplifier 36 and attenuated prior to being input to a peak detector 38. The output of the peak detector 38 is coupled to a voltage controlled attenuator (VCA) 62 having an adjustable output level. In the embodiment of FIG. 3, the RF input signal is also input to the VCA. The output of the VCA is then coupled to the directional coupler 44, as in FIG. 2. In the shown embodiment the signal produced from the monitor diode 18 is now utilized as an automatic gain controller to compensate for the drifting of the drive circuitry in the transmitter. The automatic gain control (AGC) may compensate for drifting, for example, of the RF amplifier, VCA or L/I characteristics of the laser. As would be understood by a person skilled in the art, if the bandpass filter 34 of FIG. 3 is removed, the remaining embodiment, by means of the peak detector, may still be used to monitor the presence of RF drive. In addition, the peak detector 38 may also be used to generate an alarm (as in FIG. 2) and/or to provide a AGC control voltage to compensate drifting. Moreover, if appropriate signal levels exist within the drive circuitry, the amplifier and/or attenuator may also be able to be removed.

Figure 4:
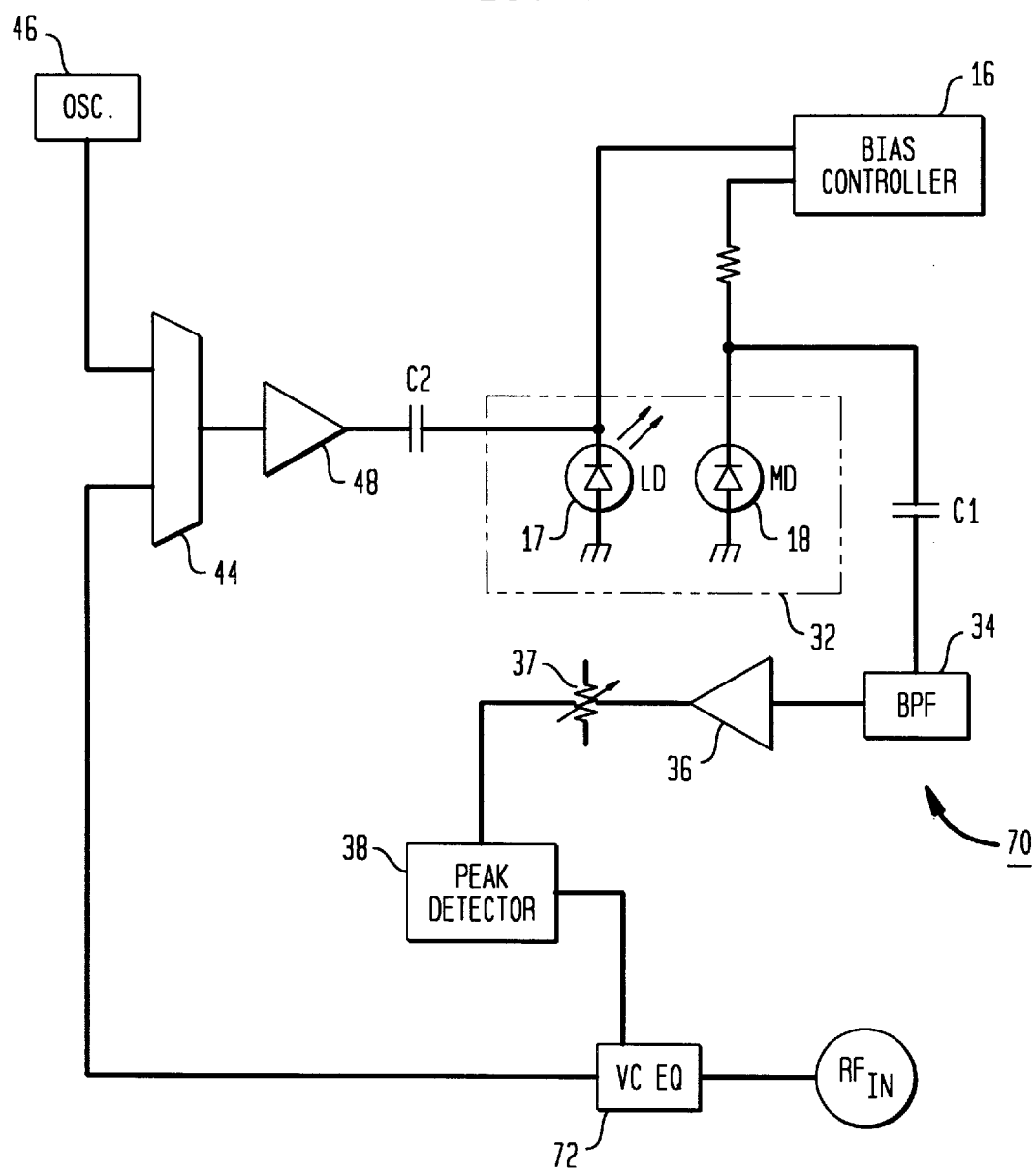
FIG. 4 shows a block diagram of a third exemplary monitoring circuit in accordance with the present invention.

Referring to FIG. 4, there is shown a second alternate embodiment of the present invention monitoring circuitry 70. The shown embodiment is similar to the embodiment of FIG. 3 with the exception that the peak detector 38 is coupled to the input of a voltage controlled equalizer (VC Eq) 72 instead of a VCA. The RF input signal is now input to the voltage controlled equalizer 72, wherein the output of the equalizer is coupled to the directional coupler 44. As would be understood, the equalizer evens out the differences in the signals received therein. The instant embodiment may be utilized as part of an end-to-end monitoring scheme which monitors the pilot tones at the optical receiver, coaxial amplifier and beyond. In addition, the instant embodiment may be utilized as part of an automatic tilt control circuit. This type of circuit compensates for changes in the RF transfer characteristics of the drive circuitry.

From the above, it should be understood that the embodiments described, in regard to the drawings, are merely exemplary and that a person skilled in the art may make variations and modifications to the shown embodiments without departing from the spirit and scope of the invention. All such variations and modifications are intended to be included within the scope of the invention as defined in the appended claims.

What is claimed is:

1. An apparatus for monitoring the drive circuitry of a laser transmitter operable to accept an AC-coupled data input signal and transmit a corresponding data output signal, said laser transmitter including a monitor diode coupled to a bias controller for adjusting the dc bias current to a laser within said laser transmitter, said apparatus comprising:

filtering means coupled to said monitor diode for filtering the dc component of a modulated signal present at said monitor diode; and peak detector coupled to said filtering means for outputting a voltage representative of the peak voltage of said modulated signal input thereto, wherein a voltage below a predetermined threshold level output from said peak detector is indicative of a failure in said drive circuitry of said laser transmitter.

2. The apparatus of claim 1, further including amplification means coupled to an output of said filtering means for amplification of said modulated signal prior to input to said peak detector.

3. The apparatus of claim 2, further including variable attenuation means coupled to an output of said amplification means, said modulated signal being selectively attenuated prior to being input at said peak detector.

4. The apparatus of claim 1, further including a bandpass filter coupled to an output of said filtering means, said bandpass filter operable to filter said modulated signal into a selected band of output frequencies.

5. The apparatus of claim 1, further including a threshold detector coupled to an output of said peak detector, said threshold detector operable to generate a first output signal in response to an input signal above a predetermined threshold level, and a second output signal in response to an input signal below said predetermined threshold level, said second output signal being indicative of an alarm condition in said drive circuitry of said laser transmitter.

6. The apparatus of claim 1, wherein an output of an oscillator for producing out-of-band pilot tones is coupled to a directional coupler, said directional coupler being coupled to an input of said laser transmitter, said apparatus further including:

voltage controlled attenuator (VCA) coupled to an output of said peak detector, said data input signal being coupled to an input of said VCA and an output of said VCA being coupled to an input of said directional coupler, wherein an output of said VCA is operable as an automatic gain controller, thereby compensating drift within said drive circuitry of said laser transmitter.

7. The apparatus of claim 1, wherein an output of an oscillator for producing out-of-band pilot tones is coupled to a directional coupler, said directional coupler being coupled to an input of said laser transmitter, said apparatus further including:

voltage controlled equalizer coupled to an output of said peak detector, said data input signal being coupled to an input of said equalizer and an output of said equalizer being coupled to an input of said directional coupler, wherein an output of said voltage controlled equalizer is operable to compensate for changes in RF frequency characteristics of said laser transmitter.

8. The apparatus of claim 1, wherein said monitor diode in said laser transmitter is a wideband PIN photodiode.

9. An apparatus for monitoring the RF drive circuitry of a laser transmitter adapted to accept an AC-coupled RF data input signal and transmit a corresponding output signal over fiber optic cable, said laser transmitter including a monitor diode coupled to a bias controller for adjusting the dc bias current to a laser within said laser transmitter, said apparatus comprising:

filtering means coupled to said monitor diode for filtering the dc component of a modulated signal present at said monitor diode;

amplification means coupled to an output of said filtering means for amplification of said modulated signal;

variable attenuation means coupled to an output of said amplification means, said modulated signal being selectively attenuatable;

peak detector coupled to said variable attenuation means for outputting a voltage representative of the peak voltage of said modulated signal input thereto, wherein a voltage below a predetermined threshold level output from said peak detector is indicative of a failure in said drive circuitry of said laser transmitter.

10. The apparatus of claim 9, further including a bandpass filter coupled to an output of said filtering means, said bandpass filter operable to filter said modulated signal into a selected band of output frequencies.

11. The apparatus of claim 10, further including a threshold detector coupled to an output of said peak detector, said threshold detector operable to generate a first output signal in response to an input signal above a predetermined threshold level, and a second output signal in response to an input signal below said predetermined threshold level, said second output signal being indicative of an alarm condition in said drive circuitry of said laser transmitter.

12. The apparatus of claim 9, wherein an output of an oscillator for producing out-of-band pilot tones is coupled to a directional coupler, said directional coupler being coupled to an input of said laser transmitter, said apparatus further including:

voltage controlled attenuator (VCA) coupled to an output of said peak detector, said data input signal being coupled to an input of said VCA and an output of said VCA being coupled to an input of said directional coupler, wherein an output of said VCA is operable as an automatic gain controller, thereby compensating drift within said drive circuitry of said laser transmitter.

13. A method for monitoring the drive circuitry of a laser transmitter adapted to accept and transmit a data input signal, said laser transmitter including a monitor diode coupled to a bias controller for adjusting the dc bias current to a laser within said laser transmitter, said apparatus comprising:

filtering the dc component of a modulated signal present at said monitor diode;

outputting from a peak detector a voltage representative of the peak voltage of said modulated signal input thereto; and determining whether said voltage output from said peak detector is below a predetermined threshold level, wherein a voltage below said predetermined threshold level is indicative of a failure in said drive circuitry of said laser transmitter.

14. The method of claim 13, further including the step of amplifying said modulated signal prior to input to said peak detector.

15. The method of claim 14, further including the step of attenuating, said modulated signal subsequent to amplification thereof.

16. The method of claim 13, further including the step of filtering said modulated signal into a selected band of output frequencies prior to said step of outputting from said peak detector.

17. The method of claim 13, further including the step of inputting said data input signal to a voltage controlled attenuator (VCA) coupled to an output of said peak detector, said VCA being coupled to an input said laser transmitter, wherein an output of said VCA is operable as an automatic gain controller to compensate drift within said drive circuitry of said laser transmitter.

18. The method of claim 13, wherein said monitor diode in said laser transmitter is a wideband PIN photodiode.

* * * * *